US007952204B2

(12) United States Patent
Liu et al.

(10) Patent No.: US 7,952,204 B2
(45) Date of Patent: May 31, 2011

(54) SEMICONDUCTOR DIE PACKAGES WITH MULTIPLE INTEGRATED SUBSTRATES, SYSTEMS USING THE SAME, AND METHODS USING THE SAME

(75) Inventors: Yumin Liu, Jiangsu (CN); Hua Yang, Jiangsu Province (CN); Yong Liu, Scarborough, ME (US); Tiburcio A. Maldo, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 365 days.

(21) Appl. No.: 12/102,793

(22) Filed: Apr. 14, 2008

(65) Prior Publication Data
US 2009/0256252 A1 Oct. 15, 2009

(51) Int. Cl.
*H01L 23/538* (2006.01)
*H01L 21/60* (2006.01)
*H01L 23/488* (2006.01)
*H01L 23/48* (2006.01)
*H01L 23/34* (2006.01)

(52) U.S. Cl. ......... 257/777; 257/E23.024; 257/E21.511; 257/E23.178; 257/E23.033; 257/E23.039; 257/686; 257/723; 257/685; 257/724; 257/728; 257/698; 257/691; 257/697; 257/E23.169; 361/803; 361/761; 361/764; 361/767; 361/777

(58) Field of Classification Search ............... 257/777, 257/686, 723, 685, 724, 728, 698, 691, E23.024, 257/E21, 511, E23.178, E23.33, E23.39, 257/E23.033, E23.039, E23.169, 778, 697; 361/803, 761, 764, 767, 777, 412; 438/107
See application file for complete search history.

(56) References Cited

U.S. PATENT DOCUMENTS

| 5,191,404 | A | * | 3/1993 | Wu et al. ...................... 257/724 |
| 6,583,503 | B2 | * | 6/2003 | Akram et al. ................. 257/686 |
| 7,154,186 | B2 | | 12/2006 | Noquil et al. |
| 7,208,819 | B2 | | 4/2007 | Jeun et al. |
| 7,408,253 | B2 | * | 8/2008 | Lin ............... 257/686 |
| 7,618,896 | B2 | | 11/2009 | Joshi et al. |
| 7,635,962 | B2 | | 12/2009 | Suh |
| 7,675,148 | B2 | | 3/2010 | Lim et al. |
| 7,706,146 | B2 | | 4/2010 | Lee et al. |

OTHER PUBLICATIONS

"AN-9035, Smart Power Module, Motion-SPM in Mini-DIP User's Guide," Rev. B, Fairchild Semiconductor Corporation, Jul. 19, 2005, pp. 1-40.
"FAN3100 Single 2A High-Speed, Low-Side Gate Driver," Rev.1.0. 0, Fairchild Semiconductor Corporation, Oct. 2007, available at website www.fairchild.com, pp. 1-19.
"High Voltage Gate Drivers (HVICs)," Lit No. 600300-001, Fairchild Semiconductor Corporation, 2007, available at website www.fairchild.com, pp. 1-2.

(Continued)

*Primary Examiner* — Alexander O Williams
(74) *Attorney, Agent, or Firm* — Kilpatrick Townsend & Stockton LLP

(57) ABSTRACT

An exemplary semiconductor die package is disclosed having one or more semiconductor dice disposed on a first substrate, one or more packaged electrical components disposed on a second substrate that is electrical coupled to the first substrate, and an electrically insulating material disposed over portions of the substrates. The first substrate may hold power-handling devices and may be specially constructed to dissipation heat and to facilitate fast and inexpensive manufacturing. The second substrate may hold packaged components of control circuitry for the power-handling devices, and may be specially constructed to enable fast and inexpensive wiring design and fast and inexpensive component assembly. The first substrate may be used with different designs of the second substrate.

28 Claims, 8 Drawing Sheets

OTHER PUBLICATIONS

"FAN7361, FAN7362, High-Side Gate Driver," Rev. 1.0.7, Fairchild Semiconductor Corporation, Feb. 2007, available at website www.fairchild.com, pp. 1-9.

"Using Intelligent Power Modules," Mitsubishi Semiconductors Power Modules MOS, Mitsubishi Electric, Sep. 1998, pp. 1-31.

Liu, Yong, "Thin Compact Semiconductor Die Packages Suitable For Smart-Power Modules, Methods Of Making The Same, And Systems Using The Same", 2008, U.S. Appl. No. 12/024,847. Entire document.

* cited by examiner

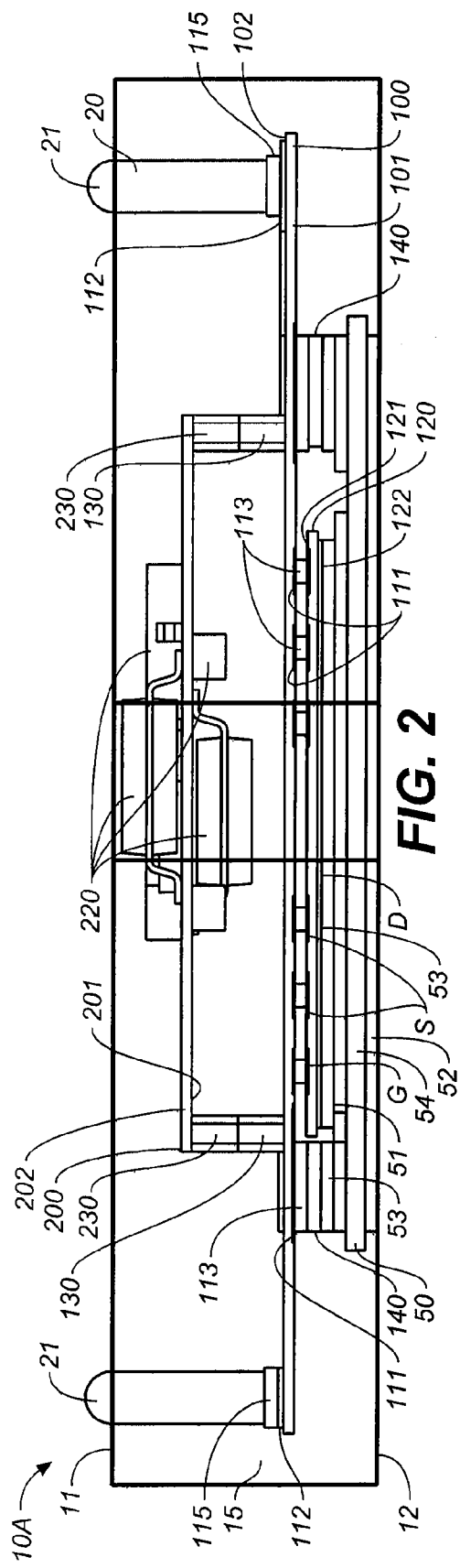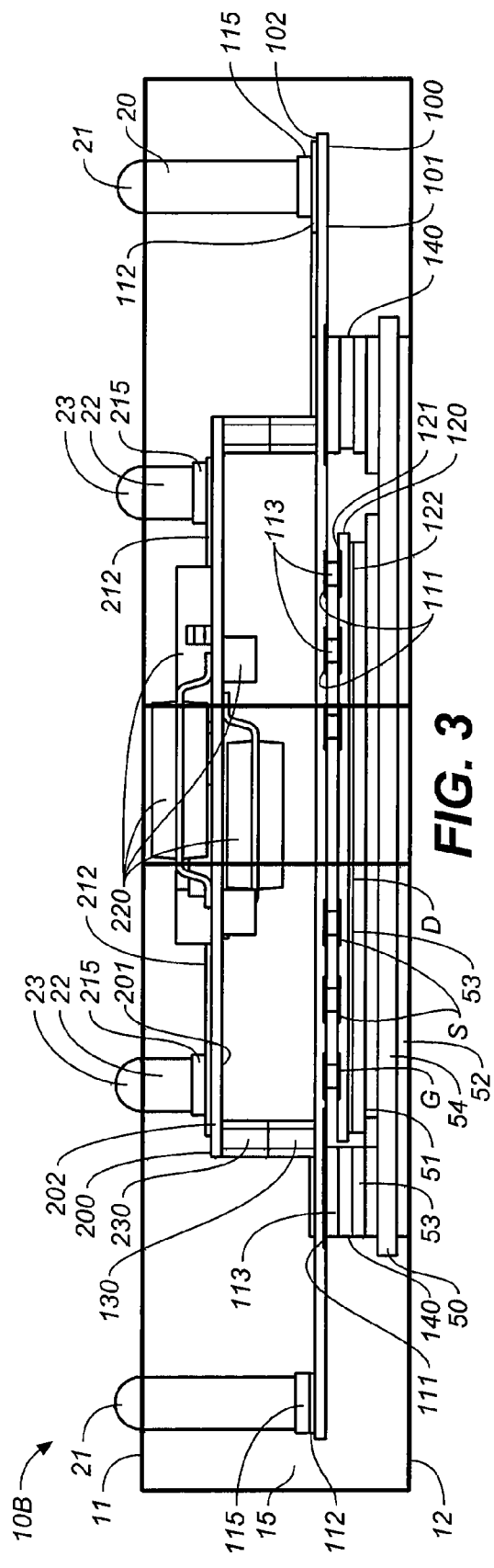

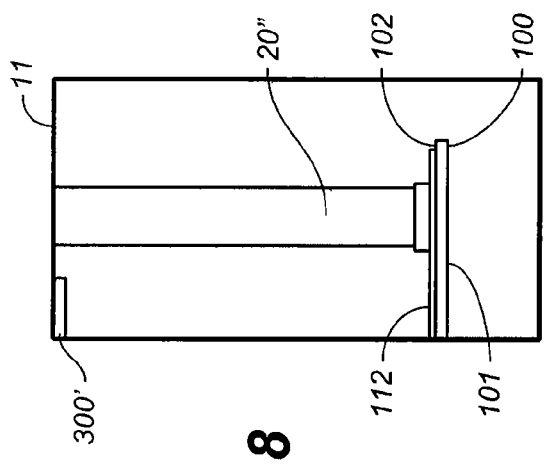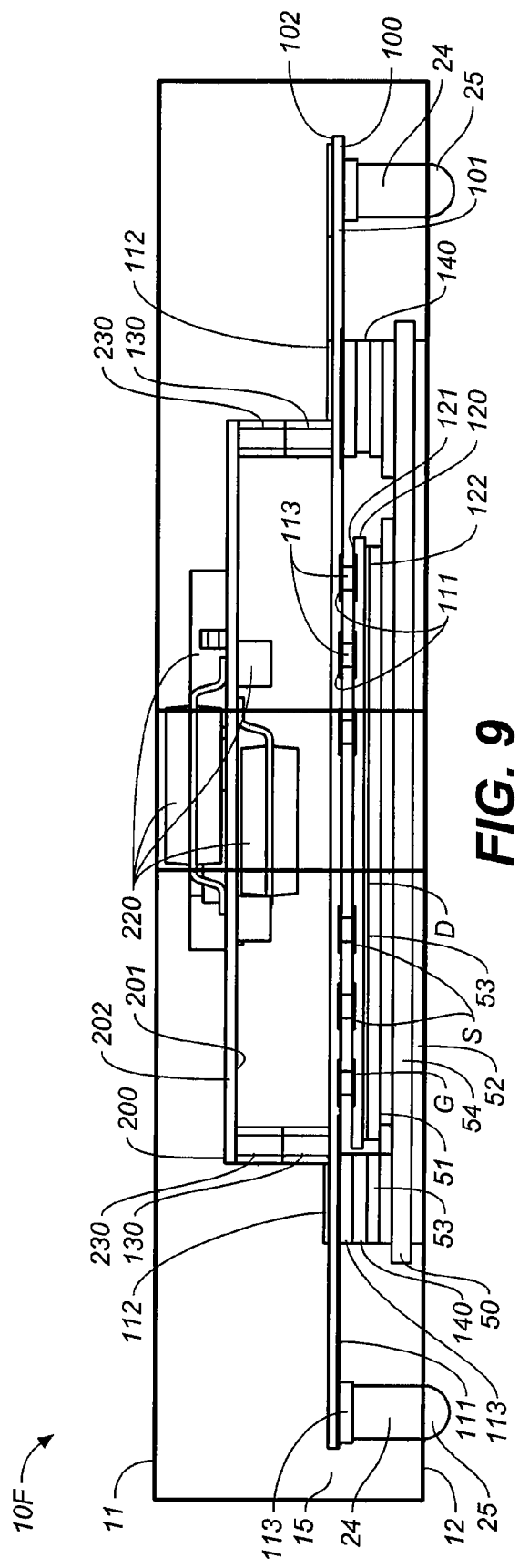

SEMICONDUCTOR DIE PACKAGES WITH MULTIPLE INTEGRATED SUBSTRATES, SYSTEMS USING THE SAME, AND METHODS USING THE SAME

CROSS-REFERENCES TO RELATED APPLICATIONS

Not Applicable

BACKGROUND OF THE INVENTION

Current smart power module (SPM) products are focusing on high power applications, such as motor drivers for air conditioners, washing machines, refrigerators, other household appliances, and the like. Such modules typically comprise one or more semiconductor power devices and one or more control chips or driver chips packaged together in a dual-in-line package with the components disposed on a leadframe and electrically interconnected with wire bonds. Smart power modules for the aforementioned applications must be small and inexpensive on the one hand, but must have high reliability on the other hand. These requirements are conflicting, and, to date, it has been difficult to achieve all of the requirements simultaneously. Adding to these conflicting goals are increasing demands from customers to add additional control circuitry to packages, and to customize the control circuitry more specifically to the applications. These customer demands conflict with the goals of decreasing package costs and increasing reliability.

BRIEF SUMMARY OF THE INVENTION

As part of making their invention, the inventors have discovered that all of these conflicts can be resolved to the benefit of customer by disposing the power-handling devices, in die form, on a first substrate that is constructed specially for power dissipation and to facilitate fast and inexpensive manufacturing, and by disposing the components for the control circuitry on at least a second substrate. The second substrate is constructed to interface with a set of connection points on the first substrate, and the components can be assembled on the second substrate with fast and inexpensive surface-mount technologies. Additional control circuitry can be accommodated by adding additional second substrates. The first substrate, second substrate(s), power-handling device dice, and control components may then be encapsulated with an electrically-insulating molding material to provide a compact and reliable package.

A first general embodiment according to the present invention is directed to a semiconductor die package comprising: a first major surface, a second major surface, a first substrate disposed between the first and second major surfaces, a second substrate disposed between the first and second major surfaces, at least one semiconductor die disposed on the first substrate, at least one packaged electrical component disposed on the second substrate, a plurality of electrical connections between the first and second substrates, and a plurality of electrical connection points to the package, each connection point being disposed at one of the major surfaces and electrically coupled to at least one of the semiconductor die and packaged electrical component.

A second general embodiment of the present invention is directed to a method of making a semiconductor die package comprising: assembling a first substrate and a second substrate together with at least one electrical connection being formed between the first and second substrates, the first substrate having a first area with at least one electrically conductive region for electrically coupling to at least one semiconductor die, the second substrate having at least one packaged electrical component disposed thereon.

Another general embodiment of the invention is directed to a system, such as an electronic device, that comprises a substrate and a semiconductor die package attached to the substrate.

These and other general embodiments of the invention are described below with reference to the accompanying figures.

BRIEF DESCRIPTION OF THE DRAWINGS

FIG. 2 shows a transparent side view of the first exemplary semiconductor die package according to the present invention.

FIG. 3 shows a transparent side view of a second exemplary semiconductor die package according to the present invention.

FIG. 8 shows a transparent side view of a variation of the fifth exemplary semiconductor die package according to the present invention.

FIG. 9 shows a transparent side view of a sixth exemplary semiconductor die package according to the present invention.

DETAILED DESCRIPTION OF THE INVENTION

Figure 1:
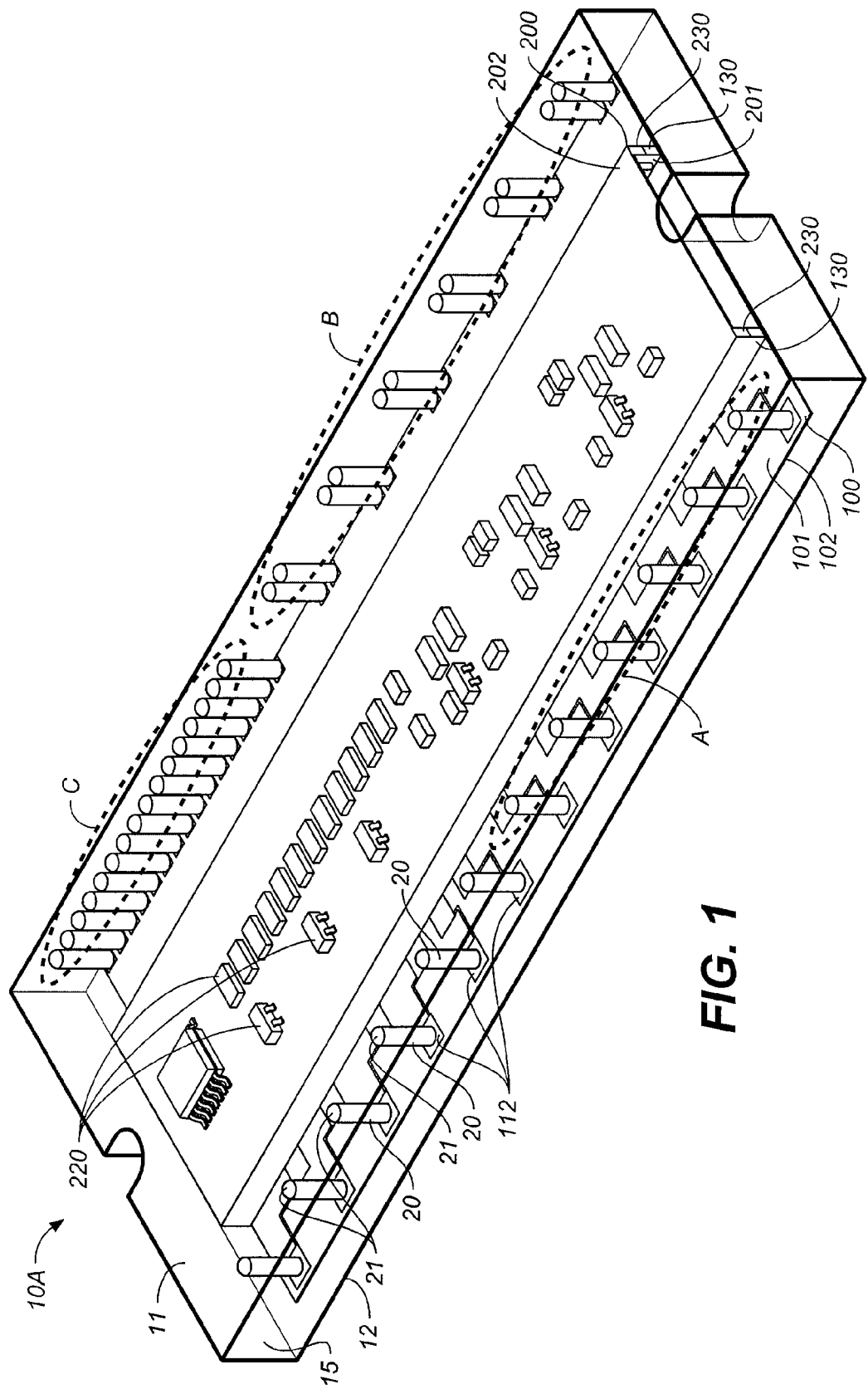
FIG. 1 shows a transparent bottom perspective view of a first exemplary semiconductor die package according to the present invention.

FIG. 1 shows a transparent bottom perspective view of a first exemplary semiconductor die package 10A according to the present invention. Package 10A comprises a first major surface 11, a second major surface 12 opposite to first major surface 11, a first substrate 100 disposed between first and second major surfaces 11 and 12, and a second substrate 200 disposed between first and second major surfaces 11 and 12, and further between first substrate 100 and first major surface 11. Package 10A further comprises a plurality of electrically conductive members 20 disposed between first major surface 11 and respective electrically conductive regions 112 of first substrate 100, and a body 15 of molding material disposed between first and second major surfaces 11 and 12 and around substrates 100 and 200 and conductive members 20. Conductive members 20 are electrically coupled to respective conductive regions 112 of substrate 100, and couple electrical input and output signals from substrate 100 to major surface 11, where their ends provide external connection points (e.g., terminals) for the signals. These ends of conductive members 20 may be flush with the major surface 11 or may be located above major surface 11. A conductive member 20 may comprise any number of shapes, with a cylindrical pin shape being shown in FIG. 1. A conductive member 20 may convey an individual control signal, as illustrated by set "C" in the figure. Two or more conductive members 20 may be grouped together to provide a coupling to the conduction terminal of a power-handling device, as illustrated by set "A," or to provide power (or ground) to the package, as illustrated by set "B." Conductive members 20 may be electrically coupled to conductive regions 112 by bodies of electrically-conductive adhesive, such as solder, and solder bumps 21 may be disposed on the exposed ends of members 20, as shown in the figure.

FIG. 2 shows a transparent side view of package 10A. Referring to both FIGS. 1 and 2, first substrate 100 has a first surface 101, a second surface 102, a plurality of conductive regions 111 disposed on first surface 101, a plurality of conductive regions 112 disposed on second surface 102, a plurality of semiconductor dice 120 (shown in FIG. 2) disposed on one or both surfaces of substrate 100 and electrically coupled to conductive regions thereat, and a first set of connectors 130 disposed on second surface 102. First substrate 100 further comprises a network of electrical traces and/or vertical connectors (e.g., vias) formed on and/or within the substrate's body to provide electrical interconnections among selected ones of conductive regions 112, conductive regions 111, and connectors 130. Second substrate 200 has a first surface 201 facing second surface 102 of substrate 100, a second surface 202, a plurality of surface-mount components 220 disposed on one or both surfaces of second substrate 200, a second set of connectors 230 disposed on first surface 201 and a network of electrical traces and/or vertical connectors (e.g., vias) formed on and/or within its body to provide electrical interconnections among components 220 and connectors 130. Each of substrates 100 and 200 may comprise a printed circuit board comprising one or more sheets of FR4 material (which is an electrically insulating material), one or more sets of vertical connectors formed through the one or more sheets, and two or more patterned metal layers disposed between the one or more sheets. Each of substrates 100 and 200 may also comprise a multi-layer ceramic substrate formed by laminating and then firing a plurality of ceramic green sheets having via holes and printed conductive paste patterns. In some implementations of the packages disclosed herein, substrate 100 may comprise a leadframe.

In preferred embodiments, some or all of dice 120 comprise power-handling devices such as power MOSFETs, BJTs, and fast recovery rectifiers. Surface mount components 220 may comprise resistors, capacitors, inductors, and packaged IC chips, all of which may be in the form of packages with or without leads. In these preferred embodiments, components 220 are configured as a group to generate control signals that are coupled to the modulation terminals on the dice (e.g., to the gates of MOSFET devices, to the bases of BJT devices, etc.), and, thus, to control the flow of power through the power-handling dice 120 on substrate 100. A plurality of signals are coupled between substrates 100 and 200 by first set of connectors 130 disposed on substrate 100 that are electrically coupled to second set of connectors 230 disposed on substrate 200. Connectors 130 and 230 may have any conventional connector form, including but not limited to: mating pin/socket configurations, opposing posts and pads coupled by reflowed solder, and opposing posts coupled by reflowed solder. Input and output electrical signals for substrate 200 can be routed through connectors 230 to connectors 130, then through traces located in or on substrate 100 to conductive members 20.

Referring to FIG. 2, semiconductor die 120 has a first surface with a plurality of conductive regions 121, and a second surface with a large conductive region 122, the second surface being opposite to the first surface. In one exemplary implementation, semiconductor die 120 comprises a vertical power device, preferably a power MOSFET device, having a first conduction terminal (e.g., source) S as a plurality of conductive regions 121, a second conduction terminal (e.g., drain) D as second conductive region 122, and a modulation terminal (e.g., gate) G as one of conductive regions 121. However, semiconductor die 120 may comprise other power devices, such as rectifiers, controlled rectifiers (e.g., SCRs), bipolar transistors, insulated-gate field-effect transistors, etc., and may comprise analog circuits such as power amplifiers. Conductive regions 121 of die 120 face respective conductive regions 111 disposed on first surface 101 of substrate 100, and are electrically coupled thereto by bodies 113 of electrically conductive adhesive material, such as solder. Conductive region 122 of die 120 faces a conductive region 51 of a third substrate 50, and is electrically coupled thereto by a body 53 of electrically conductive adhesive material. Conductive region 51 is also electrically coupled to a conductive region 111 on first surface 101 of substrate 100 by a conductive member 140 that is disposed between said conductive regions 51 and 111. Conductive member 140 may be electrically coupled to these conductive regions by bodies 53 and 113 of electrically conductive adhesive material, which may comprise solder. In this way, conductive region 51 and conductive member 140 electrically couple conductive region 122 of die 120 to first substrate 100.

Third substrate 50 preferably further comprises an electrically insulating layer 54 adjacent to conductive region 51, where insulating layer 54 preferably comprises a material having a high thermal conductivity, such as a metal oxide. Third substrate 50 is proximate to the second major surface 12 of package 10A, which enables heat from semiconductor dice 120 to be efficiently conducted to an optional heat sink disposed adjacent to second major surface 12. To facilitate the solder bonding of a heat sink to third substrate 50, third substrate 50 may comprise a metal layer 52 disposed on the surface of insulating layer 54 that is opposite to conductive region 51. Third substrate 50 may comprise a direct-bonded copper (DBC) substrate, an insulated metal (IMS) substrate, or the like. An exemplary direct bonded copper substrate comprises a sheet of ceramic material, such as alumina, with a sheet of copper bonded to each surface of the ceramic sheet by a high-temperature oxidation process (the copper and substrate are heated to a controlled temperature in an atmosphere of nitrogen containing a small amount of oxygen, around 30 ppm, which forms a copper-oxygen eutectic bonding layer between each copper sheet and the oxides present in the ceramic material). An exemplary insulated metal substrate comprises a metal sheet, such as an aluminum or copper sheet, covered by a thin layer of dielectric material (typically an epoxy-based material), which in turn is covered by a copper layer. The copper layer can be patterned to provide a desired set of conductive regions.

Third substrate 50 facilitates the use of a semiconductor die having electrical contacts on both surfaces of the die, and simplifies the manufacturing of the packages described herein. Because of its high thermal conductivity, third substrate 50 also facilitates high-power applications by easily conducting and dissipating away the heat generated by the dice coupled to it. Also, because of its stiffness and high thermal conductivity, third substrate 50 minimizes the tendency of the package to warp due to thermal stresses and thermal imbalances. These features of substrate 50 significantly improve the reliability of the package for high-power applications. For low-power applications, third substrate 50 may be omitted. The conductive region(s) at the backside of each semiconductor die located on first substrate 100 may be coupled to first substrate 100 with a die clip (also called a drain clip), or may be left exposed by body 15 of electrically insulating material as external electrical connection point to the package.

The remaining reference numbers shown in FIG. 2 were previously described with reference to FIG. 1. With the construction of package 10A, an array of power-handling devices may be assembled onto substrate 100, and the control circuitry for the array may be assembled onto substrate 200. The ends of conductive members 20 that are disposed at major surface 11 provide a plurality of electrical connection points to package 10A, with each connection point being electrically coupled to one or more of the semiconductor dice 120 on first substrate 100 and/or packaged electrical components 220 on second substrate 200. Substrate 100 may be manufactured as a stock component for a plurality of different power-handling applications, and an instance of package 10A may be customized for a specific application by providing customized control circuitry on an instance substrate 200, and marrying that instance with the stock instance of substrate 100. In this way, overall costs can be reduced by producing instances of substrate 100 in mass volume, while providing customized circuitry on instances of substrate 200. While a customized substrate 200 would likely require a new design for each new application and would likely be made in smaller production lots compared to substrate 100, which are factors that may increase the overall cost of package 10A, substrate 200 is small, does not require much in the way of power-dissipation features, and can be designed and assembled quickly, which are factors that keep the costs of making substrate 200 low. As a result, the overall cost of package 10A is less than the costs of a custom-designed package that does not use a stock instance of substrate 100. In addition, package 10A provides substantial cost savings compared to a discrete-component approach since it uses a common power-dissipation construction for the power devices, requires less board space, and can be made with less expensive assembly processes.

FIG. 3 shows a transparent side view of a second exemplary semiconductor die package 10B according to the present invention. Package 10B includes the same components as package 10A arranged in the same manner, but further comprises a plurality of electrically conductive members 22 disposed between first major surface 11 and respective electrically conductive regions 212 of second substrate 200, with conductive members 22 being electrically coupled to a plurality of the conductive regions 212. Conductive regions 212 are disposed on second surface 202 of substrate 200, and are electrically coupled to one or more of components 220. Conductive members 22 couple electrical input and output signals from substrate 200 to major surface 11, where their ends provide external connection terminals for the signals. A conductive member 22 may comprise any number of shapes, with a cylindrical pin shape being shown in FIG. 3. A conductive member 22 may convey power, ground, or a control signal to or from substrate 200. Conductive members 22 may be electrically coupled to conductive regions 212 by bodies 215 of electrically-conductive adhesive, such as solder, and solder bumps 23 may be disposed on the exposed ends of conductive members 22, as shown in the figure. Conductive members 22 provide additional flexibility in routing input and output control signals to package 10B, and can reduce the design complexity of substrates 100 and 200.

Figure 4:
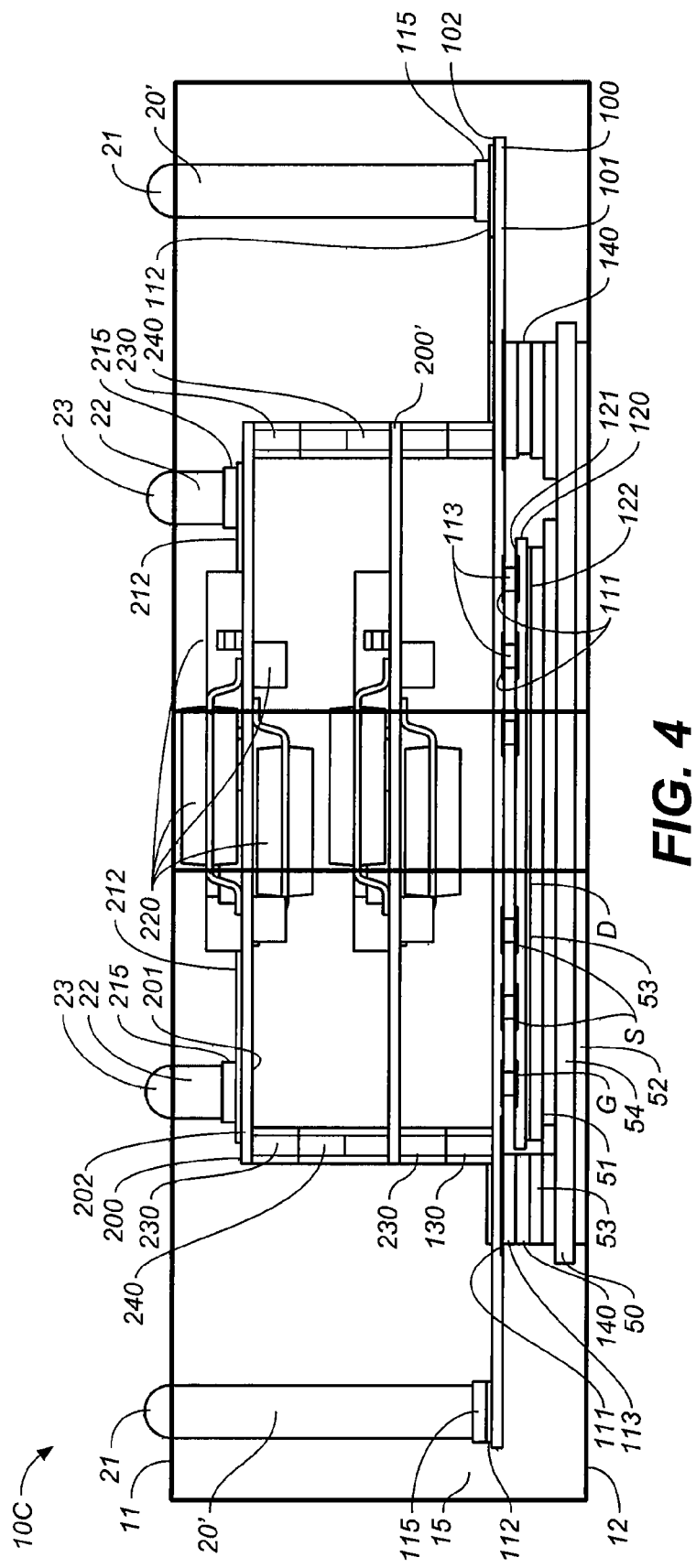
FIG. 4 shows a transparent side view of a third exemplary semiconductor die package according to the present invention.

FIG. 4 shows a transparent side view of a third exemplary semiconductor die package 10C according to the present invention. Package 10C includes the same components as package 10B arranged in the same way, with the exception that a fourth substrate 200' is disposed between first substrate 100 and second substrate 200, and that longer conductive members 20' are used in place of conductive members 20. Fourth substrate 200' has the same basic construction as substrate 200 shown in FIG. 1 in that it has surface mount components 220 and a set of connectors 230; however, fourth substrate 200' has an additional set of connectors 240, and may have a different set of surface-mount components 220 and a different interconnection of the components. Connectors 230 of fourth substrate 200' electrically connect with connectors 130 of first substrate 100, and connectors 240 of fourth substrate 200' electrically connect with connectors 230 of second substrate 200. Aside from these configuration differences, the remaining components of package 10C are arranged in the same manner as they are in package 10B. Fourth substrate 200' enables additional circuitry to be added to package 10C, without increasing the package's footprint relative to the footprints of packages 10A and 10B. Additional substrates similar to fourth substrate 200' may be stacked on either or both sides of fourth substrate 200'. Electrical connections from some of the connection points provided by conductive members 20, 22 to the electrical components 220 on substrate(s) 200' may be made through connectors 130, 230, 240, and electrically conductive regions (e.g., traces and lands) on substrates 100, 200, and 200'. Package 10C enables one to make design additions and/or design changes to an existing package product quickly and inexpensively. It also enables a product manufacturer to make an array of products by providing the core product with substrates 100 and 200, and then adding various substrates 200' to provide further models of the product.

Figure 5:
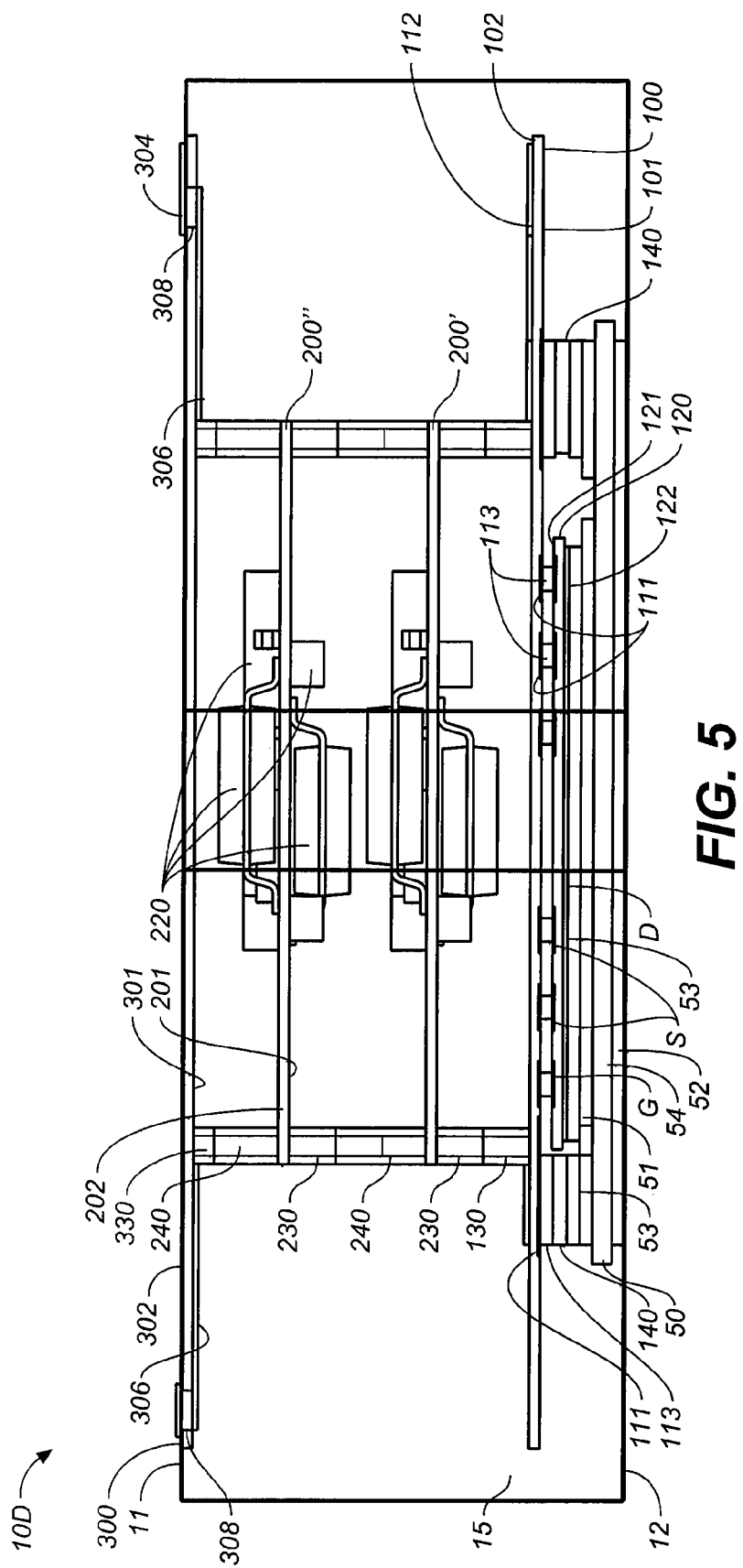
FIG. 5 shows a transparent side view of a fourth exemplary semiconductor die package according to the present invention.
Figure 6:
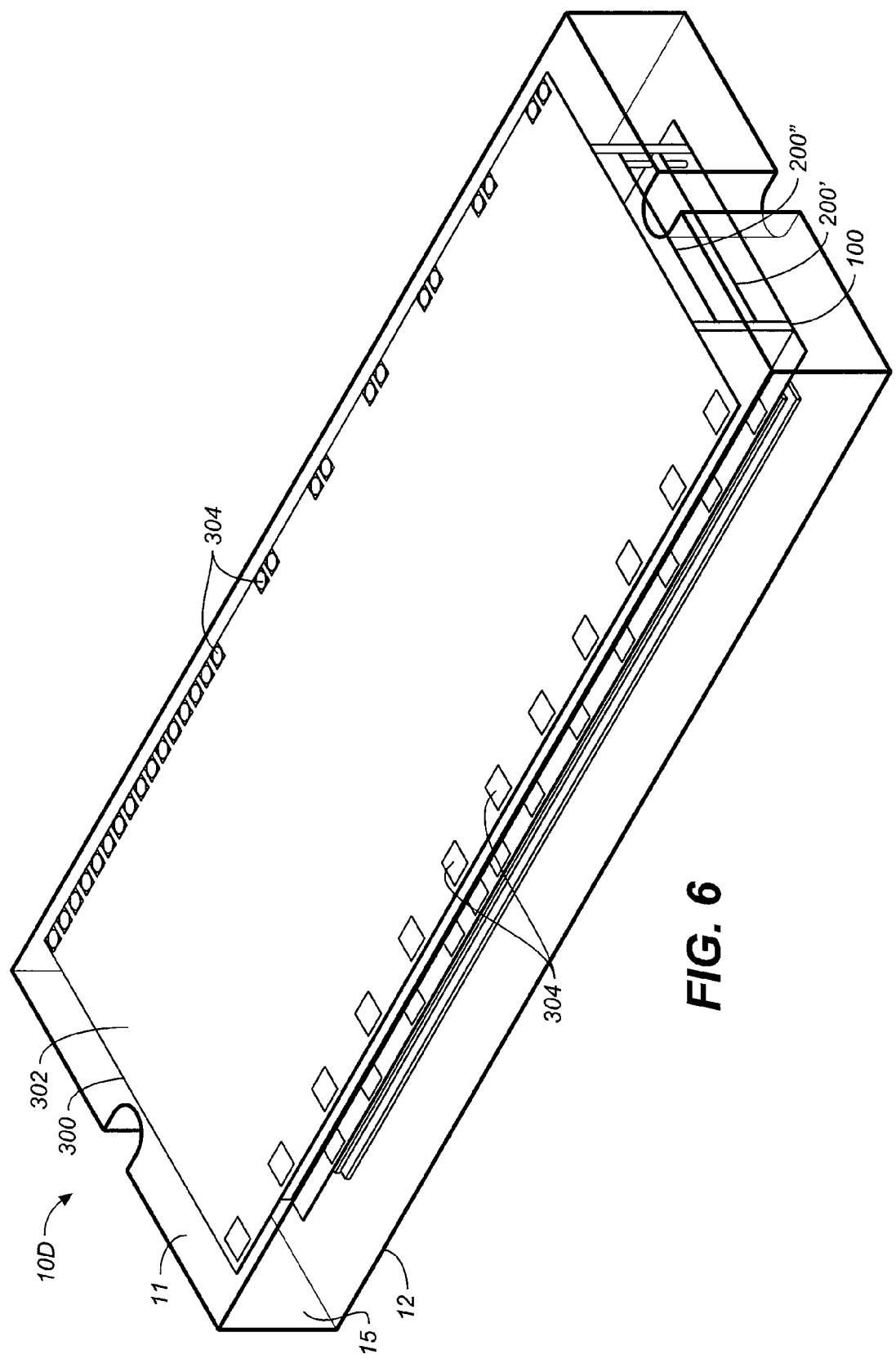
FIG. 6 shows a transparent bottom perspective view of the fourth exemplary semiconductor die package according to the present invention.

FIG. 5 shows a transparent side view of a fourth exemplary semiconductor die package 10D according to the present invention. Package 10D comprises fourth substrate 200' and third substrate 50 configured with substrate 100 as previously described for package 10C. Package 10D further comprises a fifth substrate 200" disposed above fourth substrate 200' and electrically coupled thereto, and a sixth substrate 300 disposed above fifth substrate 200". Fifth substrate 200" has a basic construction similar to fourth substrate 200' in that it has similar sets of connectors 230 and 240; however, fifth substrate 200" may have a different set of surface-mount components 220 and a different interconnection of the components. Sixth substrate 300 comprises a first surface 301 facing fifth substrate 200", a second surface 302 disposed at first major surface 11 of package 10D, a set of connectors 330 disposed on first surface 301 and electrically coupled to electrical connectors of 240 of fifth substrate 200", a plurality of interconnection lands 304 (e.g., pads) disposed on second surface 302, and a plurality of electrical traces 306 and vias 308 that interconnect connectors 330 with interconnection lands 304. The remaining reference numbers shown in FIG. 5 have been previously described with reference to previous embodiments. FIG. 6 shows a transparent bottom perspective view of package 10D. The reference numbers shown therein have been described with reference to FIG. 5. Interconnect lands 304 provide connection points to module 10D, and are electrically coupled to the surface mount components 220 and semiconductor dice 120 of the substrates by way of conductive regions (e.g., vias and traces) on the substrates and electrical connectors 130, 230, 240 and 330. Substrate 300 may be a stock component designed to provide a standard routing pattern between connectors 330 and lands 304, or may be designed to provide a custom routing pattern. As such, it may provide more routing flexibility than the configurations shown in packages 10A-10C. As substrate 300 need only comprise electrical traces, lands 304, and connectors 330 for this purpose, it may be mass produced quickly and at low cost.

Figure 7:
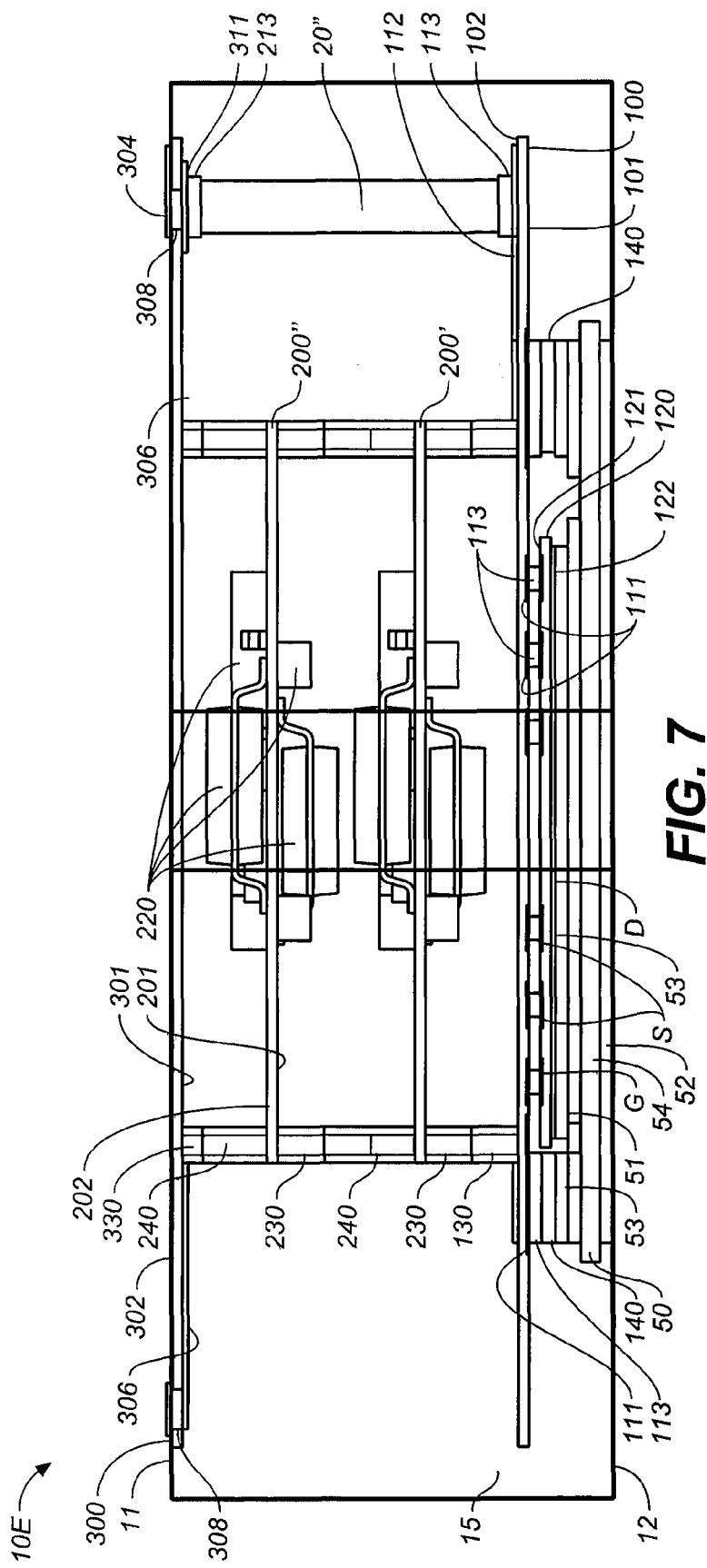
FIG. 7 shows a transparent side view of a fifth exemplary semiconductor die package according to the present invention.

FIG. 7 shows a transparent side view of a fifth exemplary semiconductor die package 10E according to the present invention. Package 10E includes the same components as package 10D, and further includes one or more conductive members 20" disposed between first substrate 100 and sixth substrate 300. Each conductive member 20", which may have the same construction as conductive member 20', has a first end electrically coupled to an electrically conductive region 112 of first substrate 100, such as by a body of conductive adhesive 113, and a second end electrically coupled to an electrically conductive region 311 on first surface 301 of substrate 300, such as by a body of conductive adhesive 313. Conductive region 311 may be coupled to a land 304 by a via 308, as shown in the figure. Conductive member 20" may be constructed to convey a higher level of current than connectors 130, 230, 240, and 330, thereby providing a higher conductance path between one or more lands 304 and dice 120 on first substrate 100. The remaining reference numbers shown in the figure were previously described above.

As a variation of package 10E, the second end of a conductive member 20" may be brought to major surface 11 rather than a conductive region 311 of substrate 300, as shown in FIG. 8. This configuration may be accomplished by using a variation 300' of substrate 300 that has a portion of the substrate omitted from the location of conductive member 200". This configuration may allow for easier manufacturing, and for the use of less complex substrates 300'.

As implementation variations, each of packages 10D and 10E may include additional substrates 200" (or 200'), or may omit substrate 200', or may omit substrate 200".

FIG. 9 shows a transparent side view of a sixth exemplary semiconductor die package 10F according to the present invention. Package 10F includes the same components as package 10A shown in FIGS. 1 and 2 with the exception that a plurality of conductive members 24 are included, and that conductive members 20 may be omitted. Conductive member 24 may have the same construction as conductive member 20. Each conductive member 24 has a first end that may be electrically coupled to a conductive region 111 of first substrate 100 by a body of electrically conductive adhesive 113, such as solder, and a second end at or above second major surface 12. Bodies 25 of conductive adhesive (e.g., solder) may be disposed on the second ends of members 24. While each of conductive members 20, 20', 20", 22, and 24 are shown as having solid construction, each of these components may comprise segments that are coupled together to form the component.

As yet further embodiments, various ones or combinations of conductive members 20, 20', 20", 22, and 24 may be added to any of the previously described packages to enable connection points to be made at both of major surfaces 11 and 12 of the package. Such configurations can enable packages to be stacked upon one another to provide additional functionality within the same board footprint.

As an additional advantage of all the packages disclosed herein, each of the substrates 50, 100, 200, 200', 200", and 300 may be individually tested before being assembled in their respective packages, thereby increasing the overall yields of the packages.

Figure 10:
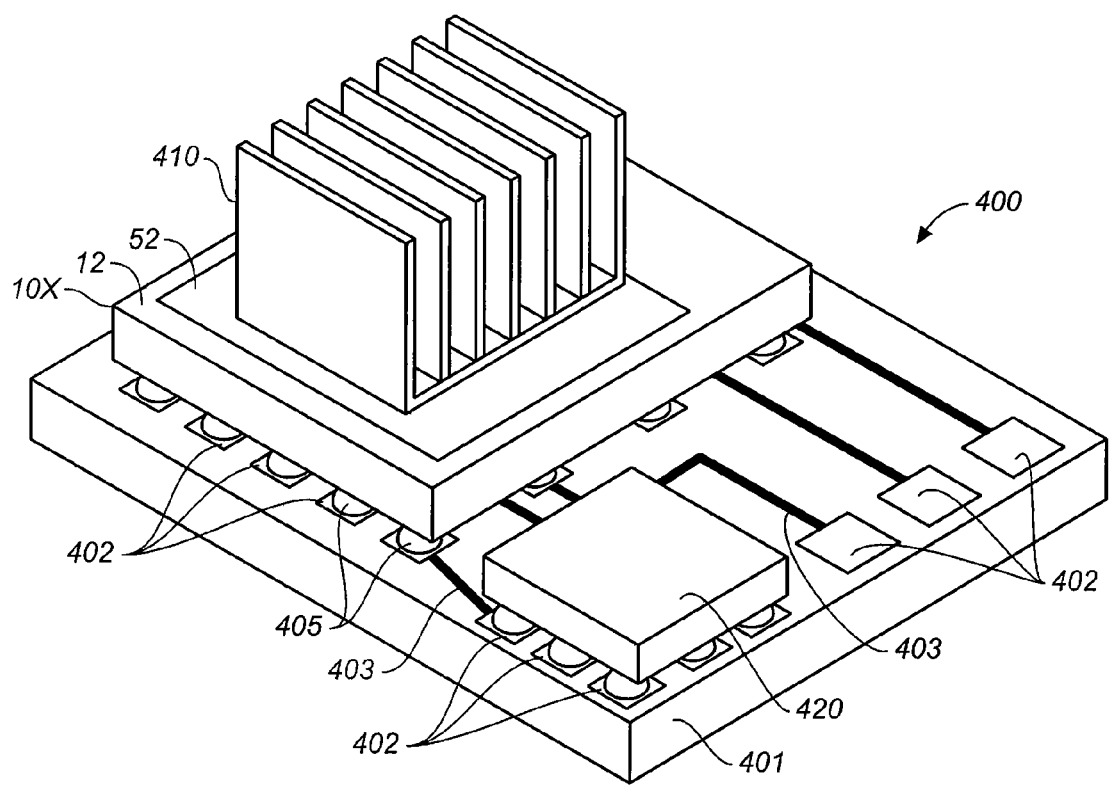
FIG. 10 shows a perspective view of a system comprising an exemplary semiconductor die package attached to an interconnect substrate according to the present invention.

FIG. 10 shows a perspective view of a system 400 that comprises semiconductor package 10X according to the present invention, where the reference number 10X denotes any of packages 10A-10F. System 400 comprises an interconnect substrate 401, a plurality of interconnect pads 402 to which components are attached, a plurality of interconnect traces 403 (only a few of which are shown for the sake of visual clarity), an instance of package 10X, a second package 420, and a plurality of solder bumps 405 that interconnect the packages to the interconnect pads 402. With the exception of package 10F, a heat sink 410 may be attached to conductive region 52 of package 10X, such as by solder, thermally conductive adhesive, or thermally conductive grease.

Exemplary methods of manufacturing packages 10A-10F are now described. Package 10A may be manufactured by assembling first substrate 100, second substrate 200, and conductive members 20 together, and thereafter disposing electrically insulating material 15 on portions of substrate 100, substrate 200, and conductive members 20 to form a package with the free ends of conductive members 20 exposed (i.e., not covered by material 15). Conductive members 20 may be assembled onto first substrate 100 before, simultaneously with, or after assembling substrates 100 and 200 together. The method may also include assembling dice 120 onto first substrate 100 and surface-mount components 220 onto second substrate 200, or these components may be preassembled onto the substrates by another entity. Third substrate 50, which is optional, may be assembled with first substrate 100 before, during, or after the assembly of substrates 100 and 200. If third substrate 50 is present, electrically insulating material 15 may also be disposed on portions of substrate 50.

Package 10B may be assembled using the above method of assembling package 10A with the additional action of assembling conductive members 22 with second substrate 200, which may occur before, during, or after assembling substrates 100 and 200 together. Package 10C may be assembled using either of the above methods of assembling packages 10A and 10B, with the additional action of assembling substrate 200' between substrates 100 and 200. Substrates 100, 200, and 200' may be assembled together in any order, including being assembled together simultaneously. Package 10F may be assembled using the above method of assembling package 10A with the additional action of assembling conductive members 24 with first substrate 100, which may occur before, during, or after assembling substrates 100 and 200 together.

Package 10D may be manufactured by assembling first substrate 100, second substrate 200', optional substrate 200", and substrate 300 (or 300') together, and thereafter disposing electrically insulating material 15 on portions of the substrates 100 to form a package with the second surface of substrate 300 exposed (i.e., not covered by material 15). The method may also include assembling dice 120 onto first substrate 100 and surface-mount components 220 onto second substrate 200, or these components may be preassembled onto the substrates by another entity. Third substrate 50, which is optional, may be assembled with first substrate 100 before, during, or after the assembly of the other substrates. If third substrate 50 is present, electrically insulating material 15 may also be disposed on portions of substrate 50. Package 10E may be assembled using the above method of assembling package 10D with the additional action of assembling each of conductive members 20" onto either of substrates 100 and 300 before the stack of substrates is finally joined. Also, with the use of suitable removable jigs, conductive members 20" and substrates 100, 200' (and optionally substrate 200"), and 300 may be simultaneously assembled together.

In all of the above methods, the conductive members of a package (20, 20', 20", 22, and 24) may be preassembled into a relatively thick carrier sheet that can be aligned to appropriate ones of the substrates. The carrier sheet may include one or more apertures to fit around one or more of connectors 130, 230, 240, and 330 and substrates 200' and 200". The carrier sheet may comprise a material that can be readily removed after the substrates and conductive members are assembled. The carrier sheet may also comprise the same material and electrically insulating material 15, or a material that adheres to or melds with electrically insulating material 15, thereby allowing the carrier sheet (or a portion thereof) to remain as part of the final package.

Also in all of the above methods, a non-volatile solder paste (e.g., a solder paste that does not emit gas upon reflow and does not require cleaning after reflow) may be used to electrically couple the conductive members to respective conductive regions of the substrates, and optionally may be used to electrically couple two or more of connectors 130, 230, 240, and 330. In this case, it is possible to dispose electrically insulating material 15 on the substrates substantially simultaneously with the assembly of the substrates. As one example, the substrates and conductive members may be aligned to one another, with non-volatile solder paste disposed in the appropriate locations, disposed in a mold, and material 15 may be disposed in the mold and about the substrates. Then the set of components may be heated to simultaneously form the electrical connections, solidify material 15, and form the final assembly.

Accordingly, it should be understood that where the performance of an action of any of the methods disclosed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action proceeds or follows another action).

The semiconductor die packages described above can be used in electrical assemblies including circuit boards with the packages mounted thereon. They may also be used in systems such as phones, computers, etc.

Some of the examples described above are directed to "leadless" type packages such as MLP-type packages (molded leadless packages) where the terminal ends of the leads do not extend past the lateral edges of the molding material. Embodiments of the invention may also include leaded packages where the leads extend past the lateral surfaces of the molding material.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. A semiconductor die package comprising:
    a first major surface and a second major surface opposite to the first major surface;
    a first substrate disposed between the first and second major surfaces, the first substrate having a plurality of electrically conductive regions;
    a second substrate disposed between the first and second major surfaces, the second substrate having a plurality of electrically conductive regions;
    at least one semiconductor die disposed on the first substrate and electrically coupled to at least one of the first substrate's conductive regions;
    at least one packaged electrical component disposed on the second substrate and electrically coupled to at least one of the second substrate's conductive regions;
    a plurality of electrical connections between the first and second substrates; and
    a plurality of electrical connection points to the package, each connection point being disposed at one of the major surfaces and electrically coupled to at least one of the semiconductor die and packaged electrical component;
    wherein the at least one semiconductor die is disposed between the first substrate and one of the major surfaces of the semiconductor die package, and wherein both of the first and second substrates are disposed between the at least one semiconductor die and the other of the major surfaces of the semiconductor die package.

2. The semiconductor die package of claim 1 further comprising at least one electrical connection between a connection point disposed on the first major surface and an electrically conductive region disposed on the first substrate.

3. The semiconductor die package of claim 1 further comprising at least one electrically conductive member disposed between a connection point at the first major surface and an electrically conductive region of the first substrate.

4. The semiconductor die package of claim 1 further comprising at least one electrical connection between a connection point at the first major surface and an electrically conductive region of the first substrate, and at least one electrical connection between another connection point at the first major surface and an electrically conductive region of the second substrate.

5. The semiconductor die package of claim 1 further comprising at least one electrically conductive member disposed between a connection point disposed on the first major surface and an electrically conductive region disposed on the second substrate.

6. A semiconductor die package comprising:
    a first major surface and a second major surface opposite to the first major surface;
    a first substrate disposed between the first and second major surfaces, the first substrate having a plurality of electrically conductive regions;
    a second substrate disposed between the first and second major surfaces, the second substrate having a plurality of electrically conductive regions;
    at least one semiconductor die disposed on the first substrate and electrically coupled to at least one of the first substrate's conductive regions;

at least one packaged electrical component disposed on the second substrate and electrically coupled to at least one of the second substrate's conductive regions;

a plurality of electrical connections between the first and second substrates; and a plurality of electrical connection points to the package, each connection point being disposed at one of the major surfaces and electrically coupled to at least one of the semiconductor die and packaged electrical component;

a third substrate disposed between the first and second major surfaces, the third substrate having a first surface facing the second substrate, a second surface opposite to the first surface, and a plurality of electrically conductive regions;

at least one packaged electrical component disposed on the third substrate; and a plurality of electrical connections between the second and third substrates.

7. The semiconductor die package of claim 6 further comprising at least one electrical connection between a connection point at the first major surface and an electrically conductive region of the first substrate.

8. The semiconductor die package of claim 6 further comprising at least one electrical connection between a connection point at the first major surface and an electrically conductive region of the third substrate.

9. The semiconductor die package of claim 6 further comprising at least one electrically conductive member disposed between a connection point at the first major surface and an electrically conductive region of the third substrate.

10. The semiconductor die package of claim 1 further comprising:

a third substrate disposed between the first major surface and the second substrate, the third substrate having a first surface facing the second substrate, and a second surface opposite to the first surface; and wherein at least one of the plurality of electrical connection points to the package is disposed on the second surface of the third substrate.

11. The semiconductor die package of claim 10 further comprising a plurality of electrical connections between the second and third substrates.

12. The semiconductor die package of claim 10 further comprising:

a fourth substrate disposed between the third and second substrates, the fourth substrate having a first surface facing the second substrate, and a second surface facing the third substrate;

at least one packaged electrical component disposed on the fourth substrate; and a plurality of electrical connections between the third and fourth substrates.

13. The semiconductor die package of claim 12 further comprising a plurality of electrical connections between the second and fourth substrates.

14. The semiconductor die package of claim 10 further comprising at least one electrically conductive member disposed between an electrically conductive region of the third substrate and an electrically conductive region of the first substrate.

15. The semiconductor die package of claim 10 further comprising at least one electrically conductive member disposed between a connection point at the first major surface and an electrically conductive region of the first substrate.

16. The semiconductor die package of claim 1 further comprising at least one electrical connection between a connection point at the second major surface and an electrically conductive region of the first substrate.

17. A system comprising a substrate and the semiconductor die package of claim 1 attached to the substrate.

18. A method of making a semiconductor die package, the method comprising: assembling a first substrate and a second substrate together with at least one electrical connection being formed between the first and second substrates, the first substrate having a first area with at least one electrically conductive region for electrically coupling to at least one semiconductor die, the second substrate having at least one packaged electrical component disposed thereon, wherein at least one semiconductor die is disposed on the first area of the first substrate; and disposing an electrically insulating material on at least a portion of each of the first substrate, second substrate, and the at least one semiconductor die to define a first major surface of the semiconductor die package and a second major surface of the semiconductor die package that is opposite to said first major surface.

19. The method of claim 18 wherein assembling the first and second substrates together further include assembling a third substrate to face the first area of the first substrate and to electrically couple to a conductive region of the at least one semiconductor die.

20. The method of claim 18 wherein assembling the first and second substrates together further includes assembling a plurality of conductive members on at least one of the substrates, each conductive member having a first end electrically coupled to a conductive region of a substrate and a second end; and wherein disposing the electrically insulating material comprises disposing the electrically insulating material on at least a portion of each of the conductive members.

21. The method of claim 18 wherein assembling the first and second substrates together further includes assembling a plurality of conductive members on both of the substrates, each conductive member having a first end electrically coupled to a conductive region of a substrate and a second end; and wherein disposing the electrically insulating material comprises disposing the electrically insulating material on at least a portion of each of the conductive members.

22. A method of making a semiconductor die package having a first major surface and a second major surface opposite to the first major surface, the method comprising: assembling a first substrate having a plurality of electrically conductive regions, a second substrate having a plurality of electrically conductive regions, and a third substrate having a plurality of electrically conductive regions together with a plurality of electrical connections being formed between the first and second substrates and a plurality of electrical connections being formed between the second and third substrates, each of the substrates being disposed between the first and second major surfaces of the semiconductor die package, the first substrate having at least one semiconductor die disposed thereon and electrically coupled to at least one of its conductive regions, the second substrate having at least one packaged electrical component disposed thereon and electrically coupled one of its conductive regions, the third substrate having a first surface facing the second substrate and a second surface opposite to the first surface, and at least one package electrical component disposed on the third substrate; and forming a plurality of electrical connection points to the package, each connection point being disposed at one of the major surfaces and electrically coupled to at least one of the semiconductor die and packaged electrical component.

23. The method of claim 22 wherein the method further comprises disposing an electrically insulating material on at least a portion of each of the first substrate, second substrate, third substrate, and the at least one semiconductor die.

24. The method of claim 22 wherein assembling the substrates together further include assembling a fourth substrate to face the first area of the first substrate and to electrically couple to a conductive region of the at least one semiconductor die.

25. The method of claim 22 wherein assembling the substrates together further includes assembling at least one conductive member between the first and third substrates, the at least one conductive member having a first end electrically coupled to a conductive region of the first substrate and a second end electrically coupled to a conductive region of the third substrate; and wherein the method further comprises disposing an electrically insulating material on at least a portion of each of the first substrate, second substrate, third substrate, the at least one semiconductor die, and the at least one conductive member.

26. The method of claim 22 wherein assembling the substrates together further includes assembling at least one conductive member with the first substrate, the at least one conductive member having a first end electrically coupled to a conductive region of the first substrate and a second end; and wherein the method further comprises disposing an electrically insulating material on at least a portion of each of the first substrate, second substrate, third substrate, the at least one semiconductor die, and the at least one conductive member.

27. The semiconductor die package of claim 1, further comprising a third substrate disposed between the at least one semiconductor die and the other of the major surface of the semiconductor die package.

28. The semiconductor die package of claim 1, wherein the third substrate comprises metal oxide substrate, a ceramic substrate, a direct bonded copper substrate, or an insulated metal substrate.

* * * * *